(12) United States Patent
Halik et al.

(10) Patent No.: US 7,582,896 B2
(45) Date of Patent: Sep. 1, 2009

(54) INTEGRATED CIRCUIT COMPRISING AN ORGANIC SEMICONDUCTOR, AND METHOD FOR THE PRODUCTION OF AN INTEGRATED CIRCUIT

(75) Inventors: Marcus Halik, Erlangen (DE); Hagen Klauk, Stuttgart (DE); Guenter Schmid, Hemhofen (DE); Andreas Walter, Dresden (DE); Ute Zschieschang, Stuttgart (DE)

(73) Assignee: Infineon Technologies AG, Munich (DE)

( * ) Notice: Subject to any disclaimer, the term of this patent is extended or adjusted under 35 U.S.C. 154(b) by 4 days.

(21) Appl. No.: 11/362,960

(22) Filed: Feb. 27, 2006

(65) Prior Publication Data

US 2006/0145149 A1  Jul. 6, 2006

Related U.S. Application Data

(63) Continuation of application No. PCT/DE2004/001903, filed on Aug. 24, 2004.

(30) Foreign Application Priority Data

Aug. 29, 2003  (DE) ................ 103 40 608

(51) Int. Cl.
  *G03C 1/00* (2006.01)
  *H01L 51/30* (2006.01)
(52) U.S. Cl. .............. 257/40; 257/E51.007; 522/1; 430/270.1
(58) Field of Classification Search ......... 257/40, 257/E51.007; 438/99; 522/1, 16–17, 21; 430/270.1, 913, 918
See application file for complete search history.

(56) References Cited

U.S. PATENT DOCUMENTS 5,717,003 A    2/1998  Bartmann et al.

(Continued)

FOREIGN PATENT DOCUMENTS

DE    38 26 363 A1    2/1990

(Continued)

OTHER PUBLICATIONS

S. Ming Lee, Jean M. J. Frechet, C. Grant Wilson. "Photo-Cross-Linking of Poly(4-hydroxystyrene) via Electrophilic Aromatic Substitution: USe of Polyfunctional Benzilic Alcohols in the Design of Chemically Amplified Resist Materials with Tunable Sensitivites." Macromolecules. vol. 27 (1994): pp. 5154-5159.*

(Continued)

*Primary Examiner*—Douglas M Menz
*Assistant Examiner*—Matthew W Such
(74) *Attorney, Agent, or Firm*—Slater & Matsil, L.L.P.

(57) ABSTRACT

An embodiment of the invention provides an integrated circuit having an organic field effect transistor (OFET) with a dielectric layer. The dielectric layer is prepared from a polymer formulation comprising: about 100 parts of at least one crosslinkable base polymer, from about 10 to about 20 parts of at least one di- or tribenzyl alcohol compound as an electrophilic crosslinking component, from about 0.2 to about 10 parts of at least one photo acid generator, and at least one solvent. Another embodiment provides a semiconductor fabrication method. The method comprises applying the polymer formulation to a surface of a substrate, drying the polymer formulation, crosslinking the polymer formulation after drying, and baking the polymer formulation after crosslinking.

10 Claims, 4 Drawing Sheets

U.S. PATENT DOCUMENTS

| | | | |
|---|---|---|---|
| 5,985,950 | A | 11/1999 | Bartmann et al. |
| 6,156,815 | A | 12/2000 | Bartmann et al. |
| 6,165,677 | A * | 12/2000 | Yako .................... 430/270.1 |
| 6,479,210 | B2 * | 11/2002 | Kinoshita et al. ........ 430/270.1 |
| 6,503,831 | B2 * | 1/2003 | Speakman .................. 438/674 |
| 6,582,627 | B1 | 6/2003 | Lutz et al. |
| 6,828,406 | B2 | 12/2004 | Haasmann et al. |
| 6,881,529 | B2 * | 4/2005 | Iwasaki .................... 430/166 |
| 6,960,489 | B2 | 11/2005 | Bernds et al. |
| 7,387,872 | B2 | 6/2008 | Halik et al. |
| 2002/0055064 | A1 * | 5/2002 | Iguchi et al. ............. 430/270.1 |
| 2002/0157758 | A1 | 10/2002 | Ickinger |
| 2002/0164547 | A1 * | 11/2002 | Ferm et al. .................. 430/321 |
| 2002/0167117 | A1 | 11/2002 | Chou |
| 2003/0027970 | A1 | 2/2003 | Haasmann et al. |
| 2003/0050390 | A1 * | 3/2003 | Weikard et al. ............. 524/589 |
| 2003/0183817 | A1 | 10/2003 | Bernds et al. |
| 2004/0063267 | A1 | 4/2004 | Bernds et al. |
| 2004/0219460 | A1 | 11/2004 | Bernds et al. |
| 2004/0242759 | A1 | 12/2004 | Bhave |
| 2005/0062174 | A1 * | 3/2005 | Ingle .......................... 257/788 |
| 2005/0127355 | A1 * | 6/2005 | Jeong et al. .................. 257/40 |
| 2005/0208779 | A1 * | 9/2005 | Klauk et al. ................. 438/795 |
| 2006/0145149 | A1 | 7/2006 | Halik et al. |

FOREIGN PATENT DOCUMENTS

| | | |
|---|---|---|
| DE | 698 09 633 T2 | 12/1998 |
| DE | 100 43 204 A1 | 4/2002 |
| DE | 100 61 297 | 6/2002 |
| DE | 101 05 914 C1 | 10/2002 |
| DE | 101 31 669 A1 | 1/2003 |
| DE | 103 29 262 B3 | 12/2004 |
| EP | 543761 A1 * | 5/1993 |
| JP | 2002-518305 | 6/2002 |
| KR | 10-2003-0016981 | 3/2003 |
| KR | 10-0428002 | 4/2004 |
| WO | WO 00/54107 | 9/2000 |
| WO | WO 02/065557 A1 * | 8/2002 |
| WO | WO 02065557 A1 * | 8/2002 |
| WO | WO 03/030252 A2 | 4/2003 |
| WO | WO 03/030254 A2 | 4/2003 |

OTHER PUBLICATIONS

S. Ming Lee and Jean M. J. Frechet. "Mechanism of the Acid-Catalyzed Crosslinking of Poly(4-hydroxystyrene) by Polyfunctional Benzylic Alcohols: A Model Study." Macromolecules. vol. 27 (1994): pp. 5160-5166.*

Lee, S.M., Frechet, J.M.J. and Willson, C.G. "Photo-Cross-Linking of Poly(4-hydroxystyrene) via Electrophilic Aromatic Substitution: Use of Polyfunctional Benzylic Alcohols in the Design of Chemically Amplified Resist Materials with Tunable Sensitivities." Macromolecules, vol. 27 (1994): pp. 5154-5159.*

Frechet, J.M.J. and Lee, S.M. "new 3-Component Aqueous Base Developable Negative Resist Systems Incorporating Chemical Amplification and Tunable Sensitivities." Proceedings of SPIE, vol. 1925 (1993): pp. 102-108.*

Fahey, J.T., et al. "Resist System Based on the Cationic Photocrosslinking of Poly(4-hydroxystyrene) and Polyfunctional Electrophiles." Journal of Polymer Science A: Polymer Chemistry, vol. 31 (1993): pp. 1-11.*

Lee, S.M., Frechet, J.M.J. and Willson, C.G. "Photo-Cross-Linking of Poly(4-hydroxystyrene) via Electrophilic Aromatic Substitution: Use of Polyfunctional Benzylic Alcohols in the Design of Chemically Amplified Resist Materials with Tunable Sensitivities." Macromolecules, vol. 27 (1994): pp. 5154-5159.*

Frechet, J.M.J. and Lee, S.M. "new 3-Component Aqueous Base Developable Negative Resist Systems Incorporating Chemical Amplification and Tunable Sensitivities." Proceedings of SPIE, vol. 1925 (1993): pp. 102-108.*

Machine Translation of KR10-2003-0016981.*

Bao, Z., et al., "Silsesquioxane Resins as High-Performance Solution Processible Dielectric Materials for Organic Transistor Applications", Advanced Functional Materials, Aug. 2002, pp. 526-531, vol. 12, No. 8.

Crone, B. K., et al., "Design and Fabrication of Organic Complementary Circuits", Journal of Applied Physics, May 1, 2001, pp. 5125-5132, vol. 89, No. 9.

Fahey, J. T., et al., "Resist System Based on the Cationic Photocrosslinking of Poly (4-Hydroxystyrene) and Polyfunctional Electrophiles". Journal of Polymer Science: Part A: Polymer Chemistry, 1993, pp. 1-11, vol. 31.

Halik, M., et al., "Fully Patterned All-Organic Thin Film Transistors", Applied Physics Letters, Jul. 8, 2002, pp. 289-291, vol. 81, No. 2.

Klauk, H., et al., "High-Mobility Polymer Gate Dielectric Pentacene Thin Film Transistors", Journal of Applied Physics, Nov. 1, 2002, pp. 5259-5263, vol. 92, No. 9.

Lee, S. M., et al., "Photo-Cross-Linking of Poly (4-hydroxystyrene) via Electrophilic Aromatic Substitution: Use of Polyfunctional Benzylic Alcohols in the Design of Chemically Amplified Resist Materials with Tunable Sensitivities", Macromolecules, American Chemical Society, 1994, pp. 5154-5159, vol. 27, No. 18.

Sheraw, C. D., et al., "Fast Organic Circuits on Flexible Polymeric Substrates", IEDM, IEEE, 2000, pp. 619-622.

Sheraw, C. D., et al., "Organic Thin-Film Transistor-Driven Polymer-Dispersed Liquid Crystal Displays on Flexible Polymeric Substrates", Applied Physics Letters, Feb. 11, 2002, pp. 1088-1090, vol. 80, No. 6.

"Photoresist", InternationalLight, NIST Traceable Light Measurement Systems, May 25, 2004, www.intl-light.com/photoresist.html, 2 pages.

Reck, B., et al., "Novel Photoresist Design Based on Electrophilic Aromatic Substitution", Polymer Engineering and Science, Jul. 1989, pp. 960-964, vol. 29, No. 14.

Halik, et al., U.S. Appl. No. 11/364,847, Office Action mailed Sep. 18, 2007, 15 pages, USPTO, Alexandria, VA.

* cited by examiner

INTEGRATED CIRCUIT COMPRISING AN ORGANIC SEMICONDUCTOR, AND METHOD FOR THE PRODUCTION OF AN INTEGRATED CIRCUIT

This application is a continuation of co-pending International Application No. PCT/DE2004/001903, filed Aug. 24, 2004, which designated the United States and was not published in English, and which is based on German Application No. 103 40 608.5 filed Aug. 29, 2003, both of which applications are incorporated herein by reference.

TECHNICAL FIELD

The invention relates generally to integrated circuit manufacturing and more particularly to organic field effect transistors (OFET).

BACKGROUND

Systems comprising integrated circuits based on organic semiconductors, in particular organic field effect transistors (OFET), constitute a promising technology in the mass application sector of economical electronics. A field effect transistor is considered to be organic particularly if the semiconducting layer is produced from an organic material.

Since it is possible to build up complex circuits using OFETs, there are numerous potential applications. Thus, for example, the introduction of RF-ID (RF-ID: radio frequency identification) systems based on this technology is considered as a potential replacement for the bar code, which is susceptible to faults and can be used only in direct visual contact with the scanner.

In particular, circuits on flexible substrates, which can be produced in large quantities in roll-to-roll processes, are of interest here.

Owing to the thermal distortion of most suitable economical substrates (e.g. polyethylene terephthalate (PET), polyethylene naphthalate (PEN)), there is an upper temperature limit of 130-150° C. for the production of such flexible substrates. Under certain preconditions, for example a thermal pretreatment of the substrate, this temperature limit can be increased to 200° C. but with the restriction that, although the distortion of the substrate is reduced, it is not prevented.

A critical process step in the case of electronic components is the deposition of the dielectric layer, in particular the gate dielectric layer, of an OFET. The quality of the dielectrics in OFETs has to meet very high requirements with regard to the thermal, chemical, mechanical and electrical properties.

Silicon dioxide ($SiO_2$) is the currently most frequently used gate dielectric in OFETs, based on the wide availability in semiconductor technology. Thus, transistor structures in which a doped silicon wafer serves as the gate electrode, and thermal $SiO_2$ grown thereon forms the gate dielectric are described. This $SiO_2$ is produced at temperatures of about 800-1000° C. Other processes (e.g. CVD) for the deposition of $SiO_2$ on various substrates likewise operate at temperatures above 400° C. A group at Penn State University has developed a process (ion beam sputtering) which makes it possible to deposit a high-quality $SiO_2$ at process temperatures of 80° C. This is described in the articles by C. D. Sheraw, J. A. Nichols, D. J. Gunlach, J. R. Huang, C. C. Kuo, H. Klauk, T. N. Jackson, M. G. Kane, J. Campi, F. P. Cuomo and B. K. Greening, Techn. Dig. -Iot. Electron Devices Meet., 619 (2000), and C. D. Sheraw, L. Zhou, J. R. Huang, D. J. Gundlach, T. N. Jackson, M. G. Kane, I. G. Hili, M. S. Hammond, J. Campi, B. K. Greening, J. Francl and J. West, Appl. Phys. Lett. 80, 1088 (2002).

However, the high process costs and the low throughput are disadvantageous here for mass-produced products.

It is also known that inorganic nitrides, such as, for example, $SiN_{x'}$, $TaN_x$, can be used. Similarly to the preparation of inorganic oxides, the deposits of inorganic nitrides require high temperatures or high process costs. This is described, for example, in the article by B. K. Crone, A. Dodabalapur, R. Sarpeshkar, R. W. Filas, Y. Y. Lin, Z. Bao, J. H. O'Neill, W. Li and H. E. Katz, J. Appl. Phys. 89, 5125 (2001).

It is also known that hybrid solutions (spin on glass) can be used. Organic siloxanes which can be prepared from a solution and can be converted into "glass-like" layers by thermal conversion were described. The conversion into $SiO_2$ is effected either at high temperatures (about 400° C.) or takes place only partly, which results in a reduced transistor quality (in this context, cf. the article by Z. Bao, V. Kuck, J. A. Rogers and M. A. Paczkowski, Adv. Funct. Mater., 12, 526 (2002).

In addition, organic polymers, such as, for example, poly-4-vinylphenol (PVP), poly-4-vinylphenol-co-2-hydroxyethyl methacrylate or polyimide (PI), have already been used. These polymers are distinguished by their comparatively simple processibility. Thus, they can be used, for example, from solution for spin coating or printing. The outstanding dielectric properties of such materials have already been demonstrated (cf. article by H. Klauk, M. Halik, U. Zschieschang, G. Schmid, W. Radlik and W. Weber, J. Appl. Phys., vol. 92, no. 9, 2002, p. 5259-5263).

It has also already been possible to demonstrate applications in interconnect layers (ICs), the required chemical and mechanical stabilities of the dielectric layers for the structuring thereof and the structuring of the subsequent source-drain layer having been achieved by crosslinking of the polymers (cf article by M. Halik, H. Klauk, U. Zschieschang, T. Kriem, G. Schmid and W. Radlik, Appl. Phys. Lett., 81, 289 (2002)). However, this crosslinking is effected at temperatures of 200° C., which is problematic for the production of flexible substrates having a large area.

SUMMARY OF THE INVENTION

In one aspect, the present invention provides an integrated circuit comprising an organic semiconductor and a method in which the production of dielectric layers of an OFET is possible at low temperatures.

An embodiment of the invention provides an integrated circuit comprising an organic semiconductor, preferably an organic field effect transistor (OFET). The OFET has dielectric layer that can be produced from a preferred polymer formulation comprising:

a) about 100 parts of at least one crosslinkable base polymer, b) from about 10 to about 20 parts of at least one di- or tribenzyl alcohol compound as the electrophilic crosslinking component, c) from about 0.2 to about 10 parts of at least one photo acid generator, and d) at least one solvent.

The integrated circuits according to the invention are in particular OFETs having organic layers, which have outstanding dielectric properties. Owing to the specific polymer formulation used, the integrated circuits can be produced in a simple manner at low temperatures (up to 150° C.). This polymer formulation can also be used in principle in combination with other electronic components.

Preferably, at least one base polymer is a phenol-containing polymer or copolymer, in particular poly-4-vinylphenol, poly-4-vinylphenol-co-2-hydroxyethyl methacrylate or poly-4-vinylphenol-co-methyl methacrylate.

Preferably, at least one di- or tribenzyl alcohol compound as electrophilic crosslinking component is 4-hydroxymethylbenzyl alcohol.

In preferred embodiments of the invention, at least one crosslinking component has one of the following structures:

wherein $R_1$ may comprise: —O—, —S—, —SO$_2$—, —S$_x$—, —(CH$_2$)$_x$—, x=1-10, and additionally:

wherein each occurrence of $R_2$ may independently comprise an alkyl having 1 to 10 carbon atoms or an aryl.

The photo acid generator used may comprise at least one compound which, on exposure to UV light, generates a photo acid for transferring a proton to the hydroxyl group of a benzyl alcohol, in particular a sulfonium or an iodonium salt.

Solvents may comprise an alcohol, in particular n-butanol, propylene glycol monomethyl ethyl acetate (PGMEA), dioxane, N-methylpyrrolidone (NMP), γ-butyrolactone, xylene or a mixture.

For good processability, it is preferred that the proportion of base polymer, crosslinking component and photo acid generator is a proportion between 5 and 20% by mass.

Other embodiments of the invention provide a method for producing an integrated circuit, preferably one having an OFET. An OFET dielectric layer may be prepared using a preferred polymer formulation. The polymer formulation is applied to a substrate, which may have a prestructured gate electrode. Embodiments may further include carrying out a photo-induced crosslinking reaction, thereby forming the gate dielectric layer.

The photoinduced crosslinking reaction is preferably initiated by exposure to UV radiation. It is particularly preferred if, after the exposure, a heating step, in particular a post exposure bake, is effected. Preferably, the temperature in the heating step is not more than 140° C., preferably about 100° C.

The polymer formulation is preferably applied using spin coating, printing, or spraying. The crosslinking reaction may be effected under an inert gas atmosphere, preferably an N$_2$ atmosphere. Embodiments may further include drying at about 100° C. after applying the polymer formulation and forming the polymer film. Forming the OFET may further include applying a source-drain layer to the gate dielectric layer.

Preferably, an active layer, which may include semiconducting pentacene, is applied to the source-drain layer. A passivating layer may be arranged on the active layer.

DESCRIPTION OF THE DRAWINGS

The invention is explained in more detail below for a plurality of embodiments with reference to the figures of the drawings.

FIG. 4 shows a trace of an oscilloscope image OFETs are electronic components which consist of a plurality of layers, all of which have been structured, in order to generate integrated circuits by connections of individual layers.

The following list of reference symbols can be used in conjunction with the figures:

1 Substrate
2 Gate electrode
3 Gate dielectric layer
4a Drain layer
4b Source layer
5 Active layer
6 Passivating layer
7 Interconnect layer

DETAILED DESCRIPTION OF ILLUSTRATIVE EMBODIMENTS

Figure 1:
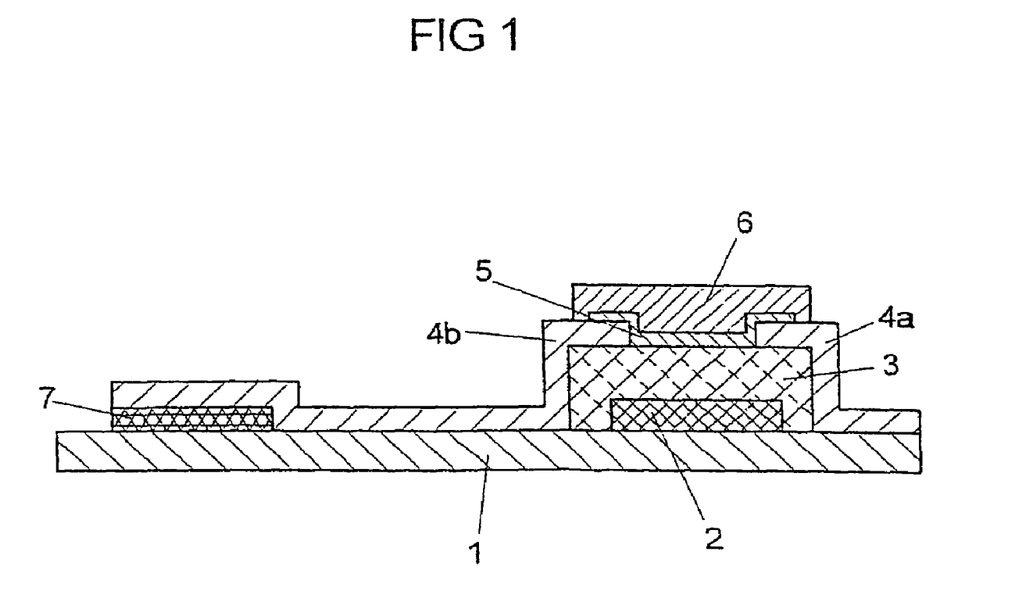
FIG. 1 shows a schematic diagram of an organic field effect transistor.

FIG. 1 shows the fundamental structure of such a transistor in a bottom contact architecture.

A gate electrode 2, which is covered by a gate dielectric layer 3, is arranged on a substrate 1. As will be explained later, in an embodiment of the process according to the invention the substrate 1 with the gate electrode 2 already arranged thereon constitutes the starting material on which the gate dielectric layer 3 is applied. A drain layer 4a and a source layer 4b, both of which are connected to the active semiconducting layer 5, are arranged on the gate dielectric layer 3. A passivating layer 6 is arranged above the active layer 5.

The source layer 4b produces a connection to the interconnect layer 7.

The deposition and processing of the gate dielectric layer 3 are preferred for that embodiment of the invention described here.

The circuits according to the invention and the production thereof solve the problem of the provision of OFETs having gate dielectric layers, in particular with organic ICs having outstanding mechanical, chemical and electrical properties in combination with low process temperatures.

An OFET has a dielectric layer that can be produced from a mixture (polymer formulation) comprising four components: a base polymer, a crosslinking component, a photo acid generator, and a solvent. An embodiment of the circuit according to the invention which is mentioned here by way of example has a polymer formulation comprising the following components:

a) PVP as the crosslinkable base polymer,
b) 4-hydroxymethylbenzyl alcohol as an electrophilic crosslinking component,
c) triphenylsulfonium hexaflate as the photo acid generator (PAG),
d) e.g. alcohols, PGMEA as the solvent.

This polymer formulation is applied to a correspondingly prepared substrate 1 (gate structures 2 have already been defined on the substrate 1). The polymer formulation can be applied, for example, by printing, spin coating or spray coating. By subsequent drying at moderate temperatures (about 100° C.), the polymer formulation is fixed on the substrate.

Thereafter, an exposure step using UV light is effected, the wavelength and the duration of the UV irradiation being dependent on the photo acid generator used. A photo acid, which initiates a crosslinking reaction in a subsequent heating step (preferably not more than 140° C., post exposure bake (PEB)), is generated from the photo acid generator.

Figure 2:
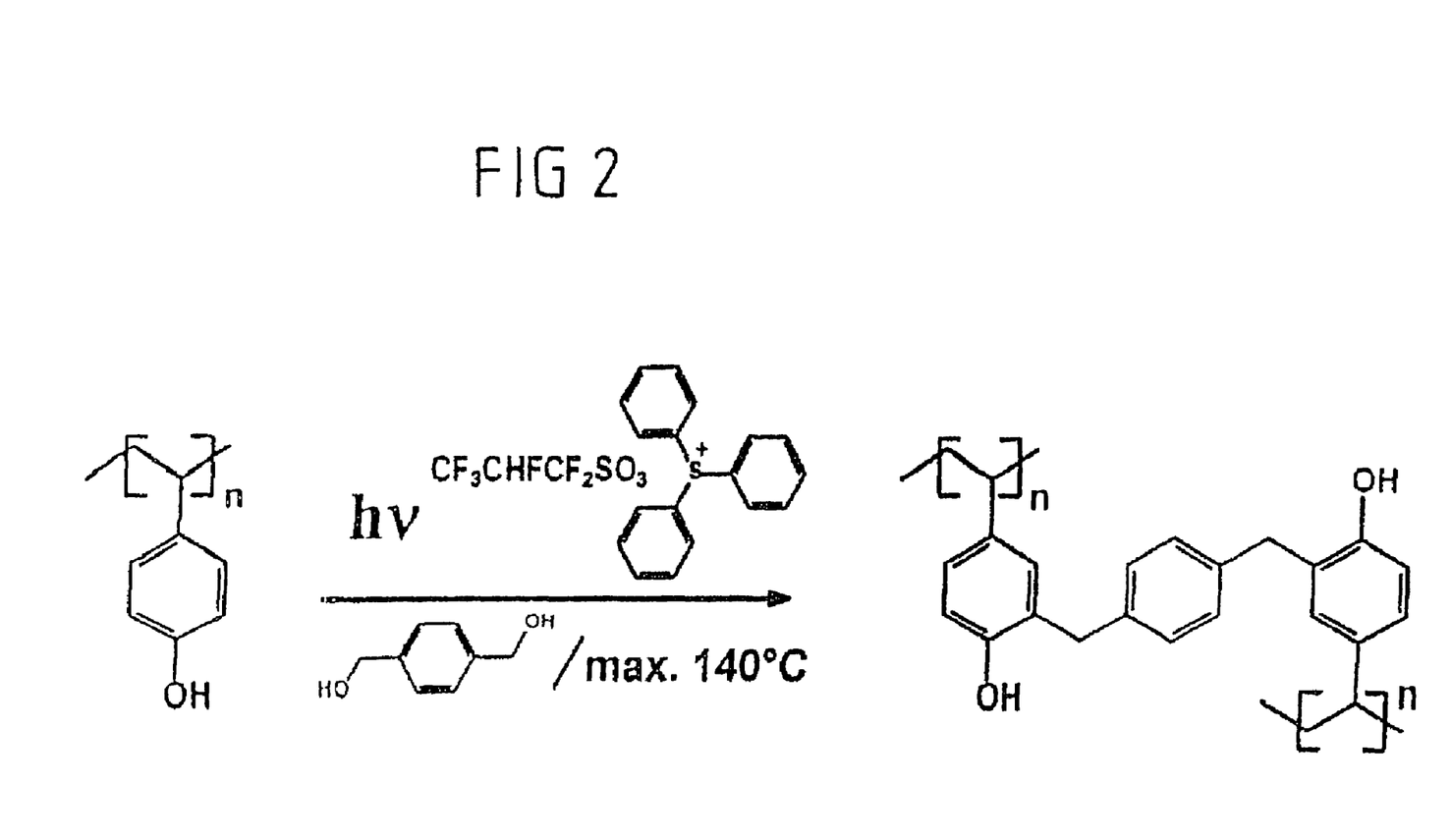
FIG. 2 shows an example of a photoinduced crosslinking reaction of a polymeric gate dielectric comprising PVP and 4-hydroxymethylbenzyl alcohol as a crosslinking agent.

FIG. 2 shows the photoinduced electrophilic crosslinking reaction of a polymeric gate dielectric for PVP by way of example with 4-hydroxymethylbenzyl alcohol as the crosslinking component. The photo acid generator used is triphenylsulfonium hexaflate.

As a result of the photochemically induced crosslinking reaction, solubility differences are produced between crosslinked and uncrosslinked material. By using masks, a definition of exposed and unexposed parts is possible thereby, which can be used for structuring the gate dielectric layer 3.

The use of the preferred process reduces the required crosslinking temperature by more than 60° C. compared with the methods known to date (cf. article by Halik et al. (2002)). The temperatures used are not critical for the substrate.

The base polymer determines the fundamental properties of the gate dielectric layer 3. Suitable base polymers are in principle all phenol-containing polymers and copolymers thereof, such as, for example, poly-4-vinylphenol, poly-4-vinylphenol-co-2-hydroxyethyl methacrylate or poly-4-vinylphenol-co-methyl methacrylate.

By the choice of the crosslinking component and the concentration thereof in the polymer formulation, the mechanical properties of the polymer layer and the resistance to chemicals can be decisively controlled.

By the choice of the photo acid generator, wavelength and exposure dose for the initiation of the crosslinking reaction can be controlled. The temperature of the post exposure bake (PEB) determines the duration of the crosslinking step since this is determined substantially by the diffusion of the photo generated acid.

The choice of the solvent determines the film formation properties of the formulation.

Two polymer formulations, which differ only in the proportion of the crosslinking agent, are described below as examples.

Formulation 1 is a 10% strength solution in propylene glycol monomethyl ether acetate (PGMEA). 100 parts of base polymer, 10 parts of crosslinking agent and 2.5 parts of photo acid generator are present.

A mixture of 2 g of PVP (MW about 20,000) as base polymer and 200 mg of 4-hydroxymethylbenzyl alcohol as crosslinking agent are dissolved in 20.5 g of PGMEA as solvent on a shaking apparatus (about 3 hours).

Thereafter, 50 mg of triphenylsulfonium hexaflate as a photo acid generator are added and the total solution is shaken for a further hour. Before use, the polymer solution is filtered through a 0.2 μm filter.

Formulation 2 is a 10% strength solution in PGMEA. 100 parts of base polymer, 20 parts of crosslinking agent and 2.5 parts of photo acid generator are present. The proportion of crosslinking agent is therefore twice as high as in the formulation 1.

A mixture of 2 g of PVP (MW about 20,000) as base polymer and 400 mg of 4-hydroxymethylbenzyl alcohol as crosslinking agent are dissolved in 20.5 g of PGMEA as solvent on a shaking apparatus (about 3 hours). Thereafter, 50 mg of triphenylsulfonium hexaflate as a photo acid generator are added and the total solution is shaken for a further hour. Before use, the polymer solution is filtered through a 0.2 μm filter.

Film preparation: 2 ml of the formulation 1 were applied by means of a spin coater at 4000 rpm for 22 s to a prepared substrate (PEN (polyethylene naphthalate) having Ti gate structures). Thereafter, drying is effected at 100° C. for 2 min on a hotplate. The layer is then exposed (wavelength 365 nm, duration 30 seconds), intensity of irradiation 7 mW/cm$^2$).

A post exposure bake is then effected at 140° C. in an oven under a 400 mbar $N_2$ atmosphere for 20 minutes.

The film preparation for formulation 2 is effected analogously.

Structuring of the Gate Dielectric Layer:

The structuring is effected as stated in the examples, except that the crosslinked polymer layer (gate dielectric layer 3) is exposed using a bright field chromium mask (chrome on glass COG). After the post exposure bake step, uncrosslinked dielectric (i.e. parts of the dielectric layer 3 which were not exposed to light) is dissolved away with acetone. The structured dielectric layer 3 remains in the exposed parts.

The source-drain layer 4a, 4b is then deposited and structured by standard methods (30 nm Au applied thermally by vapor deposition, photolithographic structuring and wet chemical etching with $I_2$/KI solution).

The layer thickness of the gate dielectric layers 2 is 200 nm for formulation 1. The roughness of the layer is 0.7 nm on 50 μm.

The layer thickness of the gate dielectric layers is 210 nm for formulation 2. The roughness of the layer is 0.7 nm on 50 μm.

The transistors or circuits are completed by applying the active component 5 (in this case pentacene) thermally by vapor deposition. Except for the passivating layer 6, the structure of an OFET according to FIG. 1 is thus produced.

Here, embodiments for a polymer formulation and the use thereof for the production of gate dielectric layers 3 at low temperatures for use in integrated circuits based on OFETs are described. These gate dielectric layers 3 are distinguished by outstanding thermal, chemical, mechanical and electrical properties in addition to the low process temperature for the production thereof.

Figure 3A:
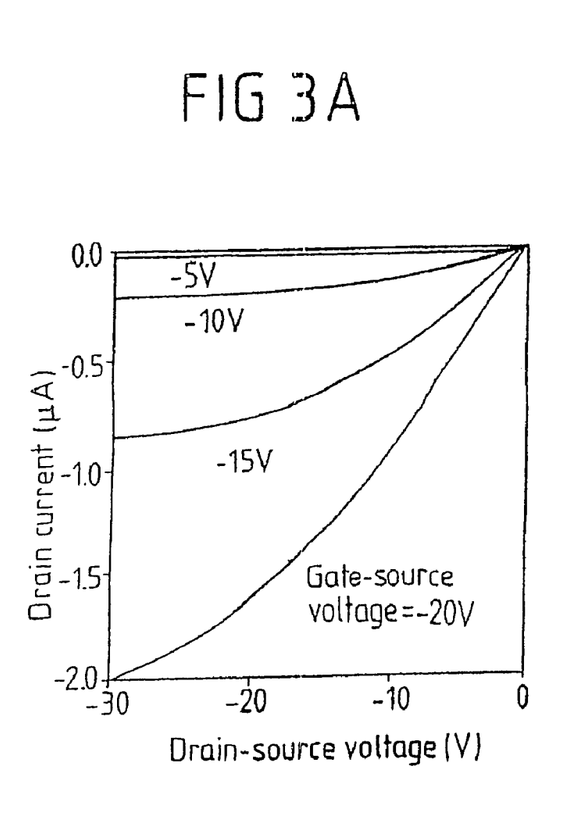
FIG. 3a shows a family of output characteristics of an OFET comprising an electrophilically crosslinked gate dielectric.
Figure 3B:
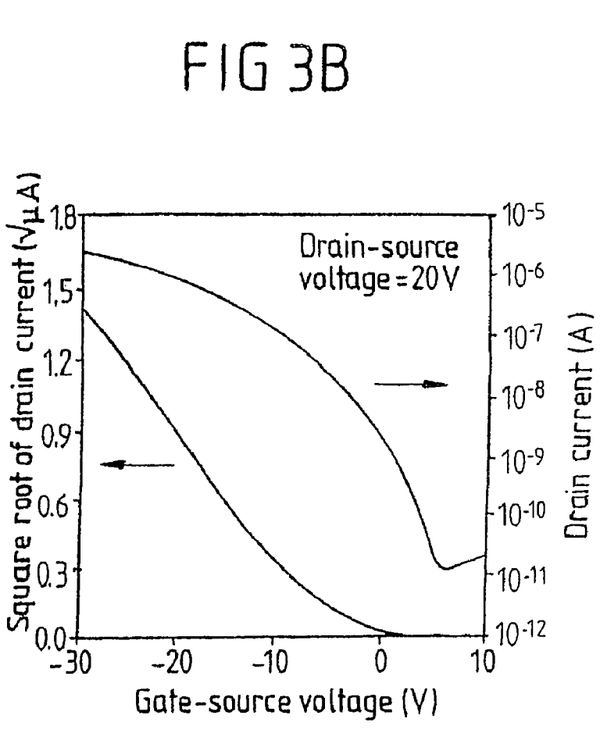
FIG. 3b shows a family of transmission characteristics of an OFET comprising an electrophilically crosslinked gate dielectric.
Figure 4:
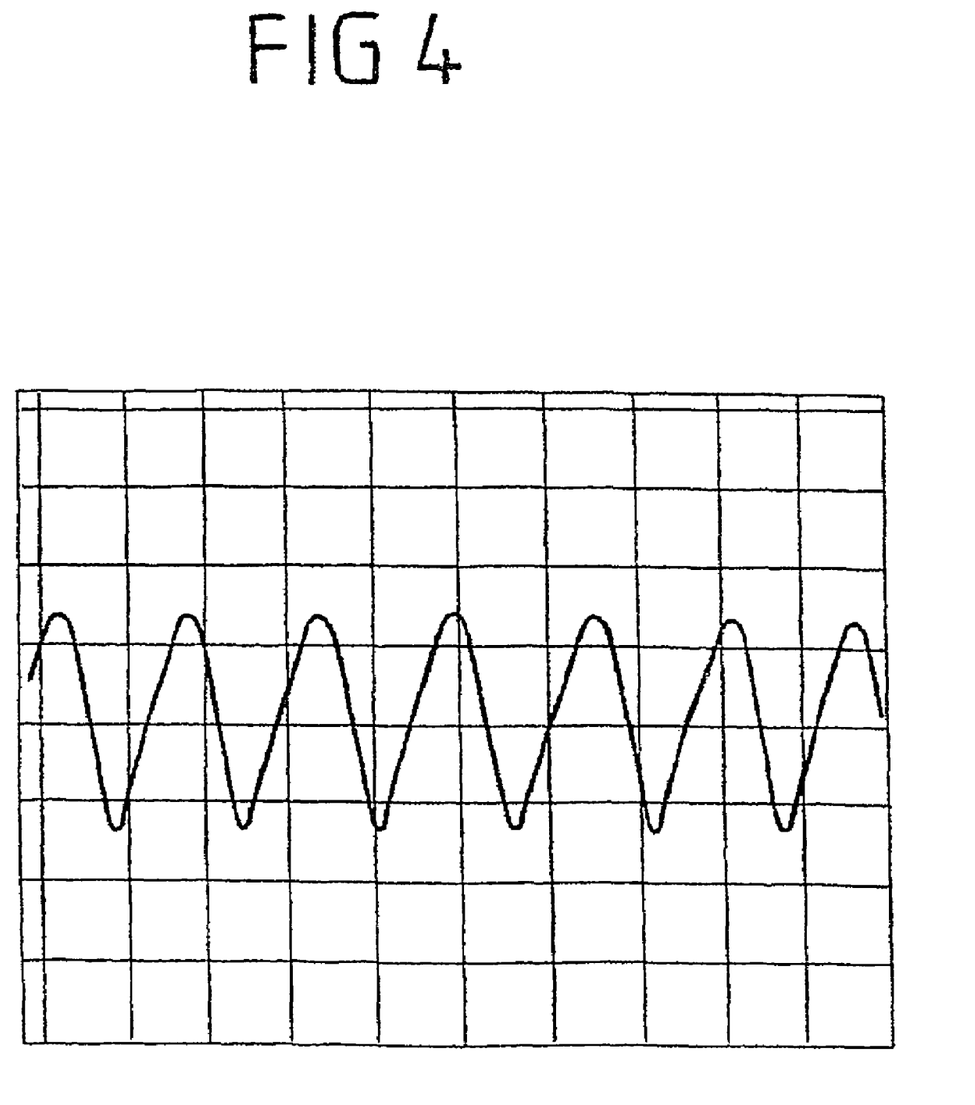

FIG. 3a shows a family of output characteristics of a pentacene OFET comprising an electrophilically crosslinked gate dielectric. FIG. 3b shows, for the same structure, the transmission characteristics of an OFET (μ=0.8 cm$^2$/Vs, on/off ratio=10$^5$). In FIG. 4, a trace of an oscilloscope diagram is reproduced. The characteristic of a 5-stage ring oscillator is shown, the ring oscillator operating with a signal lag of 80 μsec per stage.

In connection with the figures, an OFET was used as the integrated circuit in an embodiment. In principle, the integrated circuit according to the invention can, however, also have a different structure in which a dielectric layer is used.

The invention is not limited in its execution to the above-mentioned preferred embodiments. Rather, a number of variants which make use of the apparatus according to the invention and the method according to the invention also in versions of fundamentally different types is conceivable.

What is claimed is:

1. A method of producing a dielectric layer for an organic field effect transistor (OFET), the method comprising:
   providing a substrate having a prestructured gate electrode;
   applying a polymer formulation on the substrate, wherein the polymer formulation comprises:
   a. about 100 parts of at least one crosslinkable base polymer,
   b. from about 10 to about 20 parts of at least one di- or tribenzyl alcohol compound as an electrophilic crosslinking component,
   c. from about 0.2 to about 10 parts of at least one photo acid generator; and
   d. at least one solvent,
   effecting a photoinduced crosslinking reaction after applying the polymer formulation;
   performing a post exposure bake after effecting the photoinduced crosslinking reaction; and
   applying a source-drain layer to the dielectric layer after performing post exposure bake.

2. The method as claimed in claim 1, characterized wherein the photoinduced crosslinking reaction is initiated by exposure to UV radiation.

3. The method as claimed in claim 1, wherein a temperature of the post exposure bake is less than about 140° C.

4. The method as claimed in claim 1, wherein the polymer formulation is applied by spin coating, printing or spraying.

5. The method as claimed in claim 1, wherein the photoinduced crosslinking reaction is effected under an inert gas atmosphere.

6. The method as claimed in claim 1, further comprising drying the polymer formulation before effecting a photoinduced crosslinking reaction.

7. The method as claimed claim in 1, further comprising applying an active layer to the source-drain layer, wherein the active layer comprises pentacene.

8. The method as claimed in claim 7, further comprising arranging a passivating layer on the active layer.

9. A method of producing a dielectric layer for an organic field effect transistor (OFET), the method comprising:
   providing a substrate having a prestructured gate electrode;
   applying a polymer formulation on the subsrate, wherein the polymer formulation comprises:
   a. about 100 parts of at least one crosslinkable base polymer,
   b. from about 10 to about 20 parts of at least one compound as an electrophile crosslinking component,
   c. from about 0.2 to about 10 parts of at least one photo acid generator, wherein the at least one photo acid generator is triphenylsulfonium hexaflate, and
   d. at least one solvent;
   effecting a photoinduced crossliniking reaction after applying the polymer formulation;
   performing a post exposure bake after effecting the photoinduced crossliniking reaction; and
   applying a source-drain layer to the dielectric layer after performing the post exposure bake,
   wherein the compound comprises one of the following structures:

wherein R₁ comprises: —S—, —SO₂—, —Sₓ—, —(CH₂)ₓ—, x=1-10, or one or more of the following structures:

wherein each occurrence of $R_2$ independently comprises an alkyl having 1 to 10 carbon atoms or an aryl.

10. A method of producing a dielectric layer for an organic field effect transistor (OFET), the method comprising:

providing a substrate having a prestructured gate electrode;

applying a polymer formulation on the substrate, wherein the polymer formulation comprises a. about 100 parts by mass of at least one crosslinikable base polymer, b. from about 10 to about 20 parts by mass of at least one compound as an electrophilic crossliniking component, c. from about 0.2 to about 10 parts by mass of at least one photo acid generator, wherein the at least one photo acid generator is a sulfonium or an iodonium salt, and d. at least one solvent;

effecting a photoinduced crossliniking reaction after applying the polymer formulation;

performing a post exposure bake after effecting the photoinduced crossliniking reaction; and applying a source-drain layer to the dielectric layer after performing the post exposure bake wherein the compound comprises

(1,4)di-hydroxymethyl benzene, (1,4)di-hydroxymethylnaphthalene,

4-hydroxymethylphenyl-4-hydroxymethylbenzene, (1,8)dihydroxymethylanthracene, (1,3,4,6)-tetraflouro(2,5)dihydroxymethylbenzene, or the following structure:

wherein $R_1$ comprises: —S—, —SO$_2$—, —S$_x$—, —(CH$_2$)$_x$—, x=1-10, or one or more of the following structures:

wherein each occurrence of $R_2$ independently comprises an alkyl having 1 to 10 carbon atoms or an aryl.

* * * * *